(12) United States Patent
Odawara et al.

(10) Patent No.: US 11,916,175 B2
(45) Date of Patent: Feb. 27, 2024

(54) SEMICONDUCTOR LIGHT EMITTING DEVICE AND SEMICONDUCTOR LIGHT EMITTING MODULE

(71) Applicant: STANLEY ELECTRIC CO., LTD., Tokyo (JP)

(72) Inventors: Masaki Odawara, Tokyo (JP); Kenji Ikeda, Tokyo (JP); Shotaro Nishiki, Tokyo (JP); Tsuzumi Higashiyama, Tokyo (JP); Kazuhisa Shinno, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 364 days.

(21) Appl. No.: 17/440,422

(22) PCT Filed: Mar. 2, 2020

(86) PCT No.: PCT/JP2020/008761
§ 371 (c)(1),
(2) Date: Sep. 17, 2021

(87) PCT Pub. No.: WO2020/189244
PCT Pub. Date: Sep. 24, 2020

(65) Prior Publication Data
US 2022/0158042 A1 May 19, 2022

(30) Foreign Application Priority Data
Mar. 19, 2019 (JP) ................................ 2019-050632

(51) Int. Cl.
*H01L 33/50* (2010.01)

(52) U.S. Cl.
CPC ................................. *H01L 33/502* (2013.01)

(58) Field of Classification Search
CPC . H01L 33/502; H01L 25/0753; H01L 33/504; Y02B 20/00; C09K 11/77348; C09K 11/7774
See application file for complete search history.

(56) References Cited

U.S. PATENT DOCUMENTS

2008/0036364 A1* 2/2008 Li .................. C09K 11/883
313/503
2012/0319565 A1 12/2012 Sakuta et al.
(Continued)

FOREIGN PATENT DOCUMENTS

JP 2007070445 A 3/2007
JP 2013012778 A 1/2013
(Continued)

OTHER PUBLICATIONS

Extended European Search Report (EESR) dated Oct. 13, 2022, issued in counterpart European Application No. 20773277.7.
(Continued)

*Primary Examiner* — Jonathan Han
(74) *Attorney, Agent, or Firm* — Holtz, Holtz & Volek PC (57) ABSTRACT

A light emitting device includes a semiconductor light emitting element which emits excitation light having a peak wavelength in a range of 440 to 450 nm and a fluorescent body layer which is provided on the semiconductor light emitting element, is excited by the excitation light from the semiconductor light emitting element, and contains a first fluorescent body and a second fluorescent body which emit first fluorescent light and second fluorescent light. The first fluorescent light has a peak wavelength in a range of 540 to 575 nm, and the second fluorescent light has a peak wavelength in a range of 590 to 605 nm. In mixed color light of the radiation light, the intensity of the radiation light of the semiconductor light emitting element is $\frac{1}{10}$ to $\frac{1}{60}$ of the intensity of the combined light of the radiation light from the first fluorescent body and the second fluorescent body.

8 Claims, 9 Drawing Sheets

(56) References Cited

U.S. PATENT DOCUMENTS

| | | | |
|---|---|---|---|
| 2013/0082289 A1 | 4/2013 | Sakuta et al. | |
| 2013/0153882 A1 | 6/2013 | Okura et al. | |
| 2014/0233209 A1 | 8/2014 | Yoshimura et al. | |
| 2016/0304780 A1 | 10/2016 | Römer et al. | |
| 2016/0372638 A1* | 12/2016 | Todorov | H01L 33/504 |
| 2019/0140148 A1 | 5/2019 | Yoshimura et al. | |
| 2021/0225814 A1* | 7/2021 | Ueno | F21K 9/00 |

FOREIGN PATENT DOCUMENTS

| | | | |
|---|---|---|---|
| JP | 2015228419 A | 12/2015 |
| JP | 2017050283 A | 3/2017 |
| JP | 2018182028 A | 11/2018 |
| JP | 2019029584 A | 2/2019 |

OTHER PUBLICATIONS

International Search Report (ISR) (and English language translation thereof) dated Mar. 31, 2020 issued in International Application No. PCT/JP2020/008761.

Written Opinion dated Mar. 31, 2020 issued in International Application No. PCT/JP2020/008761.

Sato, "Physical Origin of Metal Color", Tokyo University of Agriculture and Technology, http://home.satogallery.com/education/kouza/metal_color_seminar.pdf.

* cited by examiner

SEMICONDUCTOR LIGHT EMITTING DEVICE AND SEMICONDUCTOR LIGHT EMITTING MODULE

TECHNICAL FIELD

The present invention relates to a semiconductor light emitting device and a semiconductor light emitting module, and more particularly to a semiconductor light emitting device and a semiconductor light emitting module that emit golden light.

BACKGROUND ART

Hitherto, there has been known a light emitting device that combines a light emitting element, such as a light emitting diode (LED), and fluorescent bodies to obtain mixed-color light. For example, Patent Literature 1 discloses a semiconductor light emitting device that combines a light emitting element with a plurality of fluorescent bodies to make it possible to output whitish mixed color light with high luminous efficiency while providing color rendering properties.

Further, Patent Literature 2 discloses a light emitting device which is provided with a semiconductor light emitting element and a plurality of fluorescent bodies and has a light emitting spectrum close to that of natural light, i.e., good color rendering properties.

Further, Patent Literature 3 discloses an LED fish attracting lamp that includes a plurality of LED chips and an LED light source containing a green fluorescent body to emit blue-green light.

Further, Non-patent Literature 1 discloses the colors of precious metals.

CITATION LIST

Patent Literatures

Patent Literature 1: Japanese Patent Application Laid-Open No. 2015-228419
Patent Literature 2: Japanese Patent Application Laid-Open No. 2007-70445
Patent Literature 3: Japanese Patent Application Laid-Open No. 2017-50283
Non-patent Literature 1: "Physical Origin of Metal Color" (Katsuaki Sato, Tokyo University of Agriculture and Technology) http://home.sato-gallery.com/education/kouza/metal_color_seminar.pdf

SUMMARY OF INVENTION

Technical Problem

Semiconductor light emitting elements such as light emitting diodes (LEDs) are widely used as light sources for lighting, for example, as the light sources for indoor lighting and the light sources for automobiles. Further, in recent years, semiconductor light emitting elements have been used as light sources for irradiating objects such as buildings or towers with light to produce landscape effect.

However, such light sources for lighting are designed for cases where the intensity of external light is low, such as at night, and do not take into account color rendering properties for cases where the intensity of natural light (external light) is high, such as during the daytime.

Further, in the past, there have been very few studies of a semiconductor light emitting device which is provided with semiconductor light emitting elements and fluorescent bodies, and emits golden light.

The present invention has been made in view of the above, and an object of the invention is to provide a semiconductor light emitting device and a semiconductor light emitting module that emit golden light which is visually recognized clearly as a gold color.

Further, an object of the present invention is to provide a semiconductor light emitting device and a semiconductor light emitting module which emit golden light with high color rendering effect, and which are especially capable of emitting golden light that is visually recognized clearly as a gold color in an environment with external light such as natural light, or emitting golden light, the reflected light of which from an object is visually recognized clearly as a gold color when the object is irradiated with the golden light.

Solution to Problem

A semiconductor light emitting device according to a first embodiment of the present invention has:

a semiconductor light emitting element which emits excitation light having a peak wavelength in a range of 440 to 450 nm; and a fluorescent body layer which is provided on the semiconductor light emitting element and contains a first fluorescent body and a second fluorescent body that emit first fluorescent light and second fluorescent light, respectively, by the excitation light from the semiconductor light emitting element, wherein the first fluorescent light has a peak wavelength in a range of 540 to 575 nm, and the second fluorescent light has a peak wavelength in a range of 590 to 605 nm, and in mixed color light of radiation light of the semiconductor light emitting element, radiation light from the first fluorescent body, and radiation light from the second fluorescent body, which is emitted from the fluorescent body layer, an intensity of the radiation light of the semiconductor light emitting element is $\frac{1}{10}$ to $\frac{1}{60}$ of an intensity of combined light of the radiation light from the first fluorescent body and the radiation light from the second fluorescent body.

Further, a semiconductor light emitting module according to another embodiment of the present invention is a semiconductor light emitting module that has:

an n (n being an integer of 2 or more) number of the semiconductor light emitting devices, wherein ratios or concentrations of the first fluorescent body and the second fluorescent body differ from each other such that, in the case where a chromaticity region enclosed by lines having main wavelengths of 565 nm and 585 nm in CIE1931 chromaticity coordinates and lines having excitation purities of 80% and 97% is segmented into an n number of chromaticity regions, the n number of semiconductor light emitting devices emit light of chromaticity in mutually different segmented chromaticity regions of the n number of the segmented chromaticity regions.

DESCRIPTION OF EMBODIMENTS

The following will describe preferred embodiments of the present invention. The embodiments may be modified or combined as appropriate. Further, substantially the same or equivalent components in the following description and the accompanying drawings will be assigned the same reference numerals in the description.

[Structure of a Semiconductor Light Emitting Device]

Figure 1A:
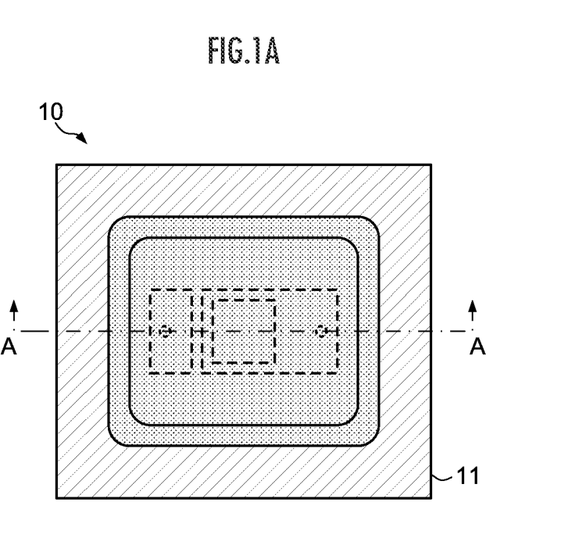
FIG. 1A is a diagram schematically illustrating the structure of a semiconductor light emitting device 10 according to a first embodiment of the present invention, and is a top view illustrating the upper surface of the semiconductor light emitting device 10.
Figure 1B:
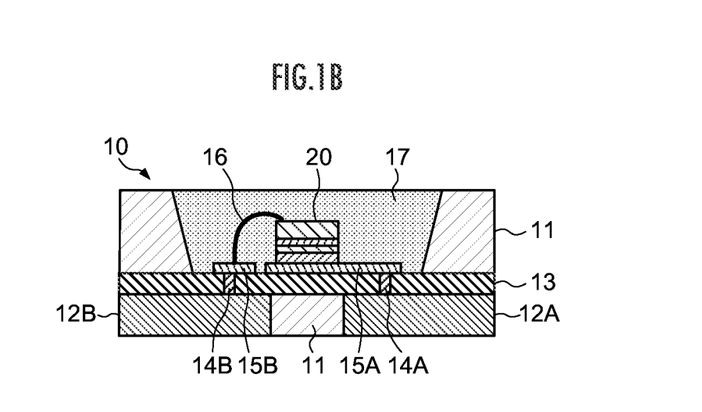
FIG. 1B is a sectional view illustrating the section taken along line A-A of the semiconductor light emitting device 10 illustrated in FIG. 1A.

FIG. 1A and FIG. 1B are diagrams schematically illustrating the structure of a semiconductor light emitting device 10 according to a first embodiment of the present invention. More specifically, FIG. 1A is a top view illustrating the upper surface of the semiconductor light emitting device 10, and FIG. 1B is a sectional view illustrating a section taken along line A-A illustrated in FIG. 1A.

Figure 2:
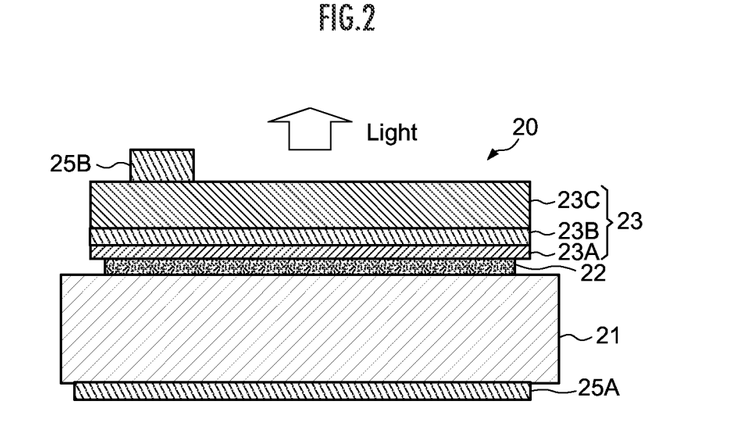
FIG. 2 is a sectional view schematically illustrating an example of the structure of a semiconductor light emitting element 20 mounted on the semiconductor light emitting device 10.

FIG. 2 is a sectional view schematically illustrating an example of the structure of a semiconductor light emitting element 20 mounted in the semiconductor light emitting device 10.

Referring to FIG. 1A and FIG. 1B, an example of the structure of the semiconductor light emitting device 10 will be described. The semiconductor light emitting device 10 has a frame 11, external electrodes 12A, 12B, a substrate 13, via wirings 14A, 14B, substrate wirings 15A, 15B, a bonding wire 16, a fluorescent body section 17, and the semiconductor light emitting element 20.

The frame 11 is made of, for example, a light-reflective white molding resin. The frame 11 has an inverted pyramid-shaped opening (recess), and the inner wall surface thereof is configured as a housing that functions as a reflector. The substrate 13 is a circuit board using an insulator, such as glass fiber reinforced epoxy, as the base body thereof. The via wirings 14A, 14B are configured as through wirings that pass through the substrate 13.

The external electrode 12A placed on the back surface of the semiconductor light emitting device 10 is electrically connected to the via wiring 14A, the via wiring 14A is electrically connected to the substrate wiring 15A, and the substrate wiring 15A is electrically connected to one electrode of the semiconductor light emitting element 20 (the electrode on the back surface of the element). The external electrode 12B is electrically connected to the via wiring 14B, the via wiring 14B is electrically connected to the substrate wiring 15B, and the substrate wiring 15B is electrically connected to the other electrode of the semiconductor light emitting element 20 (the electrode on the upper surface of the element) by the bonding wire 16.

The semiconductor light emitting element 20 is mounted on the substrate 13 in the recessed section of the frame 11, and is bonded onto the substrate wiring 15A by a bonding member such as AuSn solder or Au bumps.

The fluorescent body section (sealing section) 17 is made of a translucent sealing resin (e.g., a silicon resin), and a plurality of fluorescent bodies are contained in the resin. The fluorescent body section 17 fills the recess of the frame 11, embeds the semiconductor light emitting element 20, and functions as a sealing section. The fluorescent body section 17 is excited by the emitted light of the semiconductor light emitting element 20 and functions as a fluorescent body layer that emits fluorescence.

The structure of the semiconductor light emitting element 20 will be described. As illustrated in FIG. 2, a semiconductor light emitting structure layer (hereinafter also referred to simply as the light emitting structure layer) 23 is formed by being joined onto the substrate 21 by a junction layer 22. The substrate 21 is composed of, for example, a Si single crystal, and the junction layer 22 is composed of, for example, an Au/Ti layer and an Au/Pt/Ag layer (light reflecting layer).

The light emitting structure layer 23 has an LED (light emitting diode) structure, and is formed by stacking a p-type semiconductor layer 23A, a light emitting layer 23B, and an n-type semiconductor layer 23C in this order. The p-type semiconductor layer 23A is composed of, for example, a p-GaN layer and a p-AlGaN layer (electronic block layer) formed on the p-GaN layer.

The light emitting layer 23B is, for example, a multiple quantum well (MQW) light emitting layer having an AlInGaN layer as a quantum well layer and an AlGaN layer as a barrier layer. The n-type semiconductor layer 23C is composed of, for example, an n-AlGaN layer and an n-GaN layer formed on the n-AlGaN layer.

Figure 3:
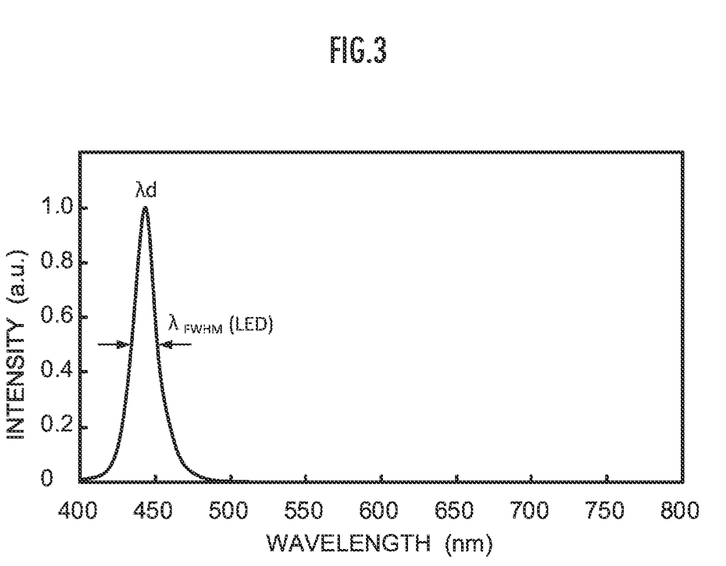
FIG. 3 is a diagram illustrating an emission spectrum of the semiconductor light emitting element 20.

The light emitting layer 23B emits blue light having a wavelength range of, for example, 440 to 450 nm, and the radiation light is emitted from the surface of the n-type semiconductor layer 23C to the outside. FIG. 3 illustrates the emission spectrum of the semiconductor light emitting element 20. In the present embodiment, the semiconductor light emitting element 20 emits blue light having an emission peak wavelength ($\lambda d$) of 445 nm and a half width ($\lambda_{FWHM}$) of 19 nm as illustrated in FIG. 3.

The layer structures, the compositions and the like of the semiconductor layer described above are merely examples. The light emitting structure layer 23 may use semiconductor layers of various compositions. The light emitting structure layer 23 may also have a layer such as a cushioning layer (buffer layer) for crystal matching or a contact layer for reducing contact resistance.

Further, in the above description, the case where the semiconductor light emitting element 20 is a so-called junction type light emitting element in which the light emitting structure layer is bonded to the support substrate has been described as an example, but the semiconductor light emitting element 20 may be a light emitting element in which a semiconductor light emitting layer is crystal-grown on a translucent substrate, or a so-called flip chip type light emitting element. Further, the light emitting element is not limited to the light emitting diode, and may be a laser diode.

[Fluorescent Body]

As described above, the fluorescent body section 17 contains a plurality of fluorescent bodies, is excited by the radiation light (excitation light) from the semiconductor light emitting element 20, and emits fluorescence. More specifically, the fluorescent body section 17 includes a fluorescent body that emits green-yellow light, e.g., a cerium-doped YAG fluorescent body (YAG: Ce), as a first fluorescent body, and a fluorescent body that emits yellow-orange light, e.g., an α-sialon (α-SiAlON: Ca, Eu) fluorescent body as a second fluorescent body.

To be more specific, the first fluorescent body is a YAG: Ce fluorescent body (rational formula being Y3Al5O12:Ce) having an average particle size (median) of 13 μm. Further, the second fluorescent body is an α-sialon (rational formula being (Si, Al) 12 (O, N) 16:Ca, Eu) having an average particle size (median) of 15 μm. The weight ratios of the first fluorescent body and the second fluorescent body are 77 wt % and 23 wt %, respectively, in the resin of the fluorescent body section 17.

Further, the concentration of the fluorescent body (the total weight of the first fluorescent body and the second fluorescent body) was approximately 50 wt %, and the thickness of the fluorescent body section 17 (i.e., the fluorescent body layer) over the semiconductor light emitting element 20 was 140 μm. The excitation purity, which will be described later, can be adjusted by changing the concentration or thickness of the fluorescent body layer.

Figure 4:
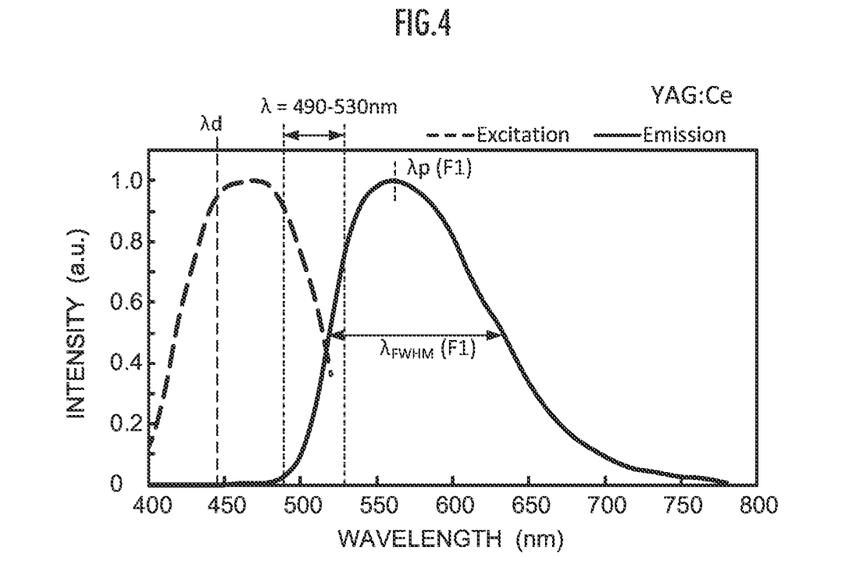
FIG. 4 is a diagram illustrating the emission spectrum (solid line) and the excitation spectrum (dashed line) of a first fluorescent body (YAG fluorescent body) used in the present embodiment, with the maximum value of each thereof being normalized to 1.

FIG. 4 illustrates the emission spectrum (solid line) and the excitation spectrum (dashed line) of the first fluorescent body (YAG fluorescent body) used in the present embodiment, with the maximum value of each thereof being normalized to 1. Further, FIG. 5 illustrates the emission spectrum (solid line) and the excitation spectrum (dashed line) of the second fluorescent body (α-sialon fluorescent body) used in the present embodiment, with the maximum value of each thereof being normalized to 1.

As illustrated in FIG. 4, the peak wavelength ($\lambda p$ (F1)) of the first fluorescent body was approximately 560 nm and a half width ($\lambda_{FWHM}$ (F1)) was approximately 112 nm. As can be seen from the emission spectrum of the first fluorescent body (YAG fluorescent body), the first fluorescent body has a large spectral component in a blue-green band (wavelength band: 490-530 nm).

Figure 5:
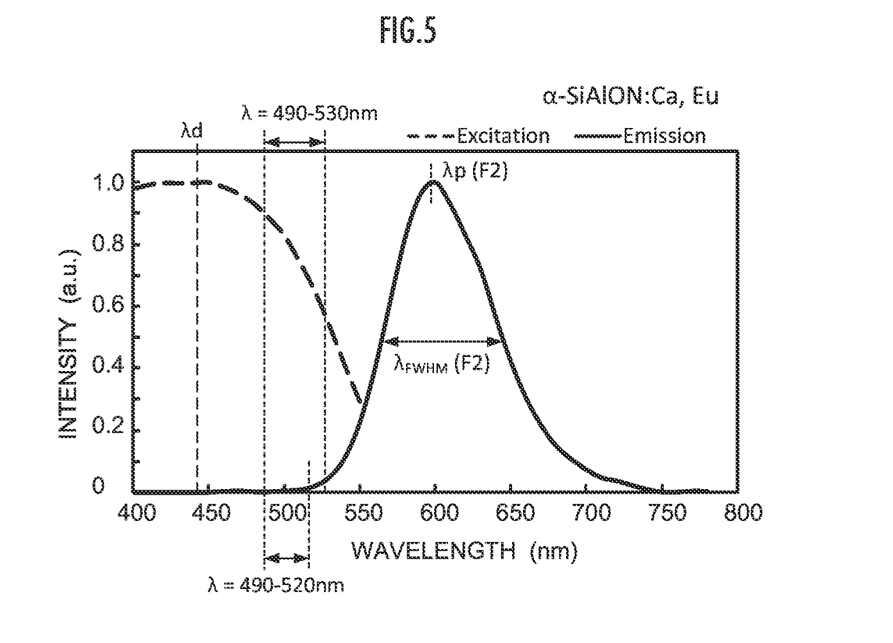
FIG. 5 is a diagram illustrating the emission spectrum (solid line) and the excitation spectrum (dashed line) of a second fluorescent body (α-sialon fluorescent body) used in the present embodiment, with the maximum value of each thereof being normalized to 1.

As illustrated in FIG. 5, the peak wavelength ($\lambda p$ (F2)) of the second fluorescent body was approximately 595 nm and a half width ($\lambda_{FWHM}$ (F2)) was approximately 80 nm.

As can be seen from the emission spectrum of the second fluorescent body (α-sialon fluorescent body), the second fluorescent body has an extremely small spectral component in the blue-green band (wavelength band: 490 to 530 nm). On the other hand, as can be seen from the excitation spectrum of the second fluorescent body, the blue-green band light emitted from the first fluorescent body is absorbed by the second fluorescent body.

[Spectrum of the Radiation Light from the Semiconductor Light Emitting Device 10]

Figure 6:
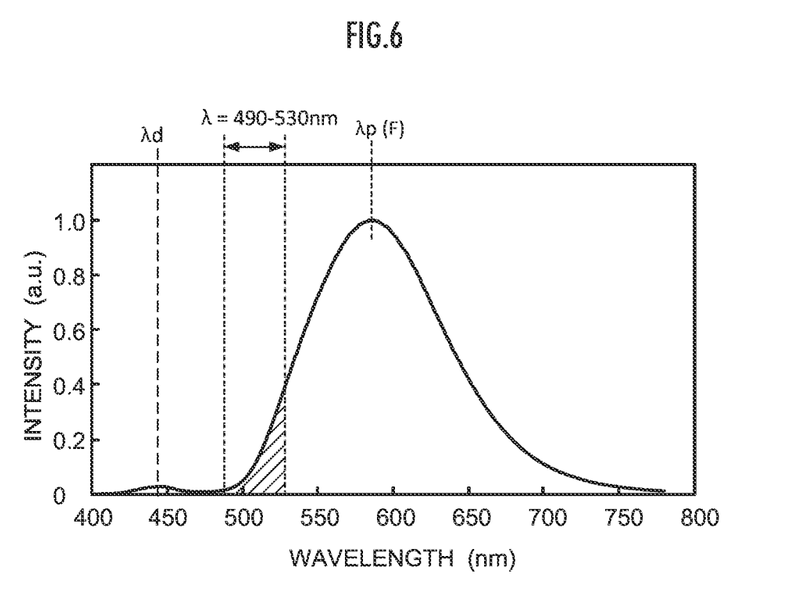
FIG. 6 is a diagram illustrating the spectrum of radiation light from the semiconductor light emitting device 10.

FIG. 6 illustrates the spectrum of the radiation light from the semiconductor light emitting device 10. The radiation spectrum includes the blue light (peak wavelength ($\lambda d$)) emitted from the semiconductor light emitting element 20 and passing through the fluorescent body section 17 (the fluorescent body layer), and the composite radiation light from the first fluorescent body and second fluorescent body. As in the case of FIG. 4 and FIG. 5, the maximum values of the radiation spectra are normalized to 1.

The light emitting output of the element itself of the semiconductor light emitting element 20 was approximately 1.2 W, and the light output of the radiation light from the semiconductor light emitting device 10, i.e., the blue light from the semiconductor light emitting element 20, and the composite radiation light of the light emitted from the first fluorescent body and the light emitted from the second fluorescent body was approximately 1.0 W.

The peak wavelength ($\lambda p$ (F)) of the fluorescent body composite spectrum of the radiation light from the fluorescent bodies was approximately 585 nm, and the half width ($\lambda_{FWHM}$ (F)) was 107 nm.

The peak intensity of the blue light ($\lambda d$=445 nm) emitted from the semiconductor light emitting device 10 was approximately $\frac{1}{25}$ (=4%) of the peak intensity of the composite radiation light from the first fluorescent body and the second fluorescent body.

Further, the ratio of the light component (FIG. 6) in the blue-green band (wavelength band: 490-530 nm) in the composite radiation light is reduced as compared with the case where the first fluorescent body illustrated in FIG. 4 is alone. This indicates that the radiation light component in the blue-green band of the first fluorescent body (YAG fluorescent body) was consumed by the excitation of the second fluorescent body (α-sialon fluorescent body) (refer to FIG. 5) and reduced. In other words, as illustrated in FIG. 5, the blue-green band component of the emitted light from the second fluorescent body is extremely small, and the second fluorescent body functions as an absorber of the emitted light from the first fluorescent body in the blue-green band.

Referring to FIG. 6, the integral value of the intensity (the integral value of spectral intensity, i.e., the area of the radiation light component in the spectrum, indicated by hatching) of the radiation light component in the blue-green band (wavelength band: 490 to 530 nm) was approximately 6% of the integral value of the overall intensity of the fluorescent body composite spectrum. This value indicates a reduction as compared with the integral value of the intensity of the light in the blue-green band, which was approximately 14% of the overall integral value in the fluorescence spectrum of the first fluorescent body illustrated in FIG. 4.

Further, considering the ratio of the second fluorescent body to the fluorescent bodies contained in the above-mentioned resin (the entire first and second fluorescent bodies), it was estimated that the blue-green band component of the emission light from the first fluorescent body was attenuated to an intensity of approximately 45% and emitted from the semiconductor light emitting device 10. In other words, the rate of absorption of the blue-green band light of the first fluorescent body by the second fluorescent body was estimated to be approximately 55%.

The intensity of the light in the blue-green band is important to achieve golden light that is visually recognized as more golden. It has been found that, as described above, the added second fluorescent body acts as an absorber for the light in the blue-green band of the first fluorescent body, and the light component (intensity) of the blue-green band can be adjusted by adjusting the ratio of the second fluorescent body in the overall fluorescent body.

Thus, it has been found that it is possible to achieve a semiconductor light emitting device that emits golden light which is visually recognized more clearly as gold in an external light environment such as natural light, or as reflected light from an object when light is irradiated on the object.

In addition, as illustrated in FIG. 5, in the emission spectrum from the second fluorescent body, the blue-green band component in the 490 to 520 nm band is negligibly small when measurement errors and the like are taken into account. In the blue-green band (490 to 520 nm band), the second fluorescent body functions as a mere absorber of the light emitted from the first fluorescent body.

It has been found that the integral value of the intensity of the radiation light component in the blue-green band described above is a value within a predetermined range of the integral value of the overall intensity of the fluorescent body composite spectrum, specifically within a predetermined range of 2 to 7%, which enables the realization of a semiconductor light emitting device that emits golden light that is visually recognized clearly as a gold color.

Alternatively, it has been found that a semiconductor light emitting device which emits golden light that is visually recognized more clearly as a gold color can be achieved by setting the ratio of the second fluorescent body in the fluorescent body layer (or the ratio of the second fluorescent body to the first fluorescent body) such that the second fluorescent body absorbs the blue-green band light from the first fluorescent body such that the fluorescence intensity of the blue-green light of the first fluorescent body is reduced to 20 to 60% (a predetermined attenuation rate) and then the light is emitted from the fluorescent body layer (all fluorescent bodies). It has been found that the predetermined attenuation rate is more preferably 20 to 50%.

[Golden Light Under an External Light Environment and Reflected Light from an Object]

(1) Golden Light in an External Light Environment

The main wavelengths of a gold color in sunlight (standard light) and a gold color which people perceive to be definitely a gold color are substantially the same, but the excitation purities significantly differ. A more detailed description will be given with reference to the CIE chromaticity diagram (CIE1931) established by the CIE (International Commission on Illumination) illustrated in FIG. 7 and FIG. 8. FIG. 8 is an enlarged view illustrating the vicinity of the main wavelength of 565 nm to 585 nm.

Figure 7:
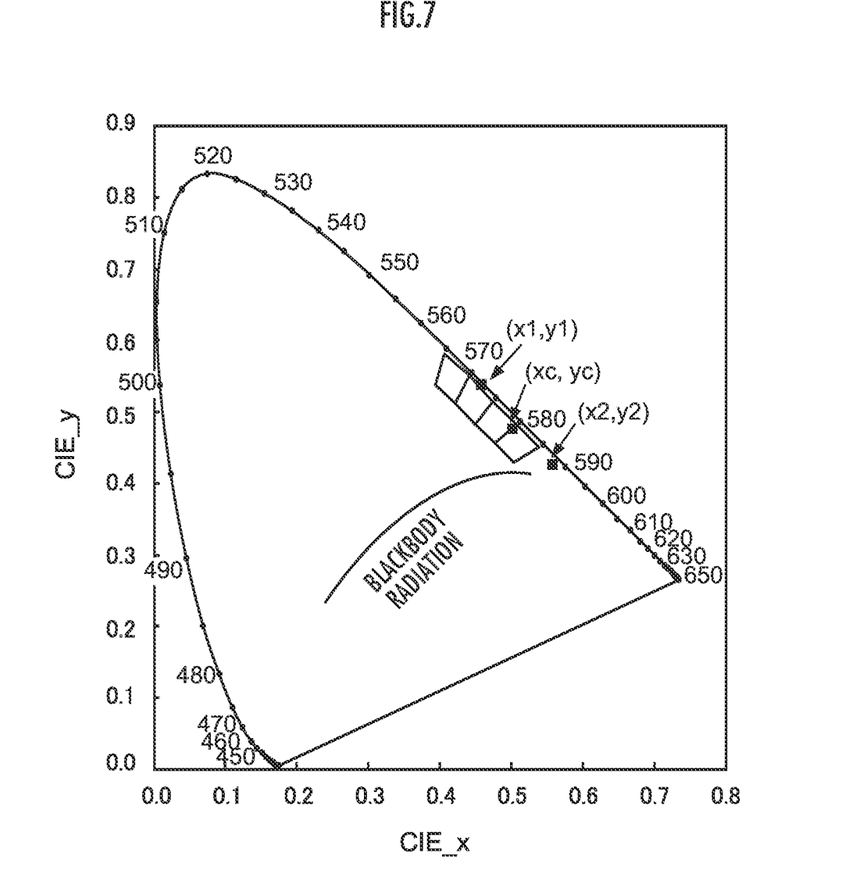
FIG. 7 is a diagram illustrating a CIE chromaticity diagram (CIE1931)
Figure 8:
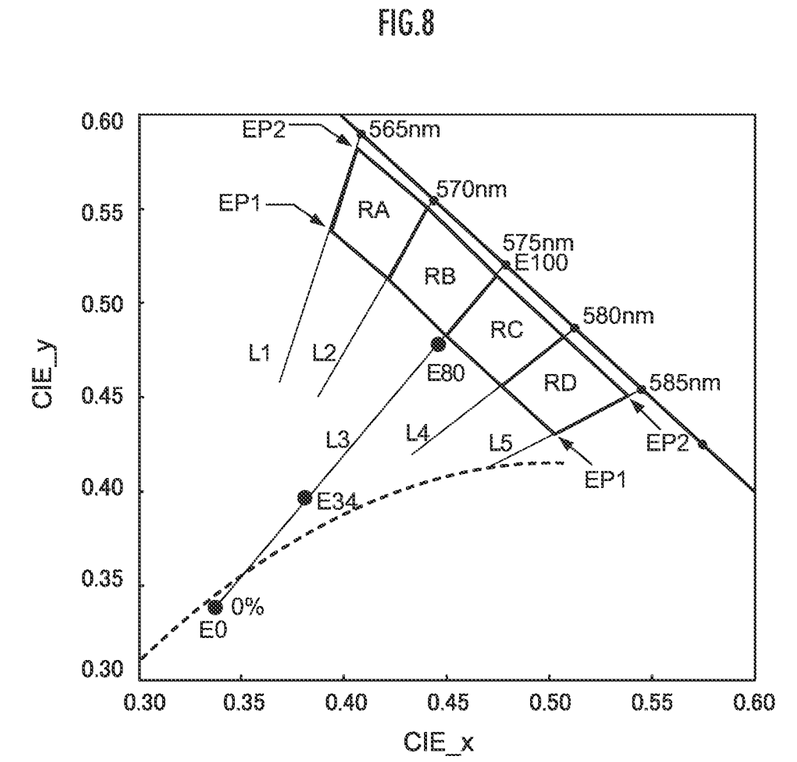
FIG. 8 is an enlarged view of the vicinity of main wavelengths of 565 nm to 585 nm in the CIE chromaticity diagram of FIG. 7.

Referring to FIG. 7, the chromaticity coordinates of the spectral peak of the first fluorescent body (YAG) were (x1, y1)=(0.456, 0.535), the chromaticity coordinates of the spectral peak of the second fluorescent body (α-sialon) were (x2, y2)=(0.573, 0.424), and the chromaticity coordinates of the peak of the composite spectrum of the first and the second fluorescent bodies were (xc, yc)=(0.497, 0.484).

Further, the gold color is "#FFD700" in hexadecimal color code, and the xyz color mixing ratio in the CIE 1931 chromaticity coordinates is (x, y, z)=(0.450, 0.481, 0.068), with an excitation purity of 80% (point E80 in FIG. 8). In addition, the main wavelength of this color is approximately 575.64 nm.

The excitation purity in the case where the main wavelength is 575 nm will be described with reference to FIG. 8. Straight line L3 connecting a point with an excitation purity of 0%, i.e., a point (E0) at (x=0.333, y=0.333), and a point on the spectral monochromatic locus (575 nm, E100), which is a point with an excitation purity of 100%, is defined as the main wavelength 575 nm, and the distance from the point with the excitation purity of 0% to the point on the spectral locus (575 nm) is defined as the excitation purity. L1, L2, . . . , L5 are straight lines having main wavelengths of 565 nm, 570 nm, . . . , 585 nm (5 nm intervals).

For example, regarding the excitation purity in the standard light, the excitation purity of the reflected light of gold with a main wavelength of 575 nm, which is calculated from the spectrum of a standard light source (D65) and the reflectance of gold described in the Non-patent Literature 1, is approximately 34% (E34), whereas the excitation purity of the color that people recognize (visually recognize) as definitely being the color of gold is 80% (E80), thus indicating that the excitation purities significantly differ.

Gold (metal) looks whitish yellow in sunlight. The spectrum of sunlight or the standard light source (D65) is a spectrum in which wavelengths are continuous over an entire visible light range. Consequently, the reflection spectrum of gold becomes light containing a large amount of blue to green components and appears whitish. In other words, external light (white light such as sunlight) is added to the reflected light from gold, and the excitation purity is lowered by additive color reduction, and the color approaches white.

Taking into account the influence of external light (white light), golden light that people can visually recognize more clearly as a gold color can be achieved by setting the excitation purity of the golden light to a value exceeding 80%.

The inventors of the present application have found that, in an environment of external light (white light), radiation light that is recognized as more golden can be obtained by considerably suppressing blue light from the semiconductor light emitting element 20 (LED) and using blue light components emitted from light emitting device 10 at low intensity in a predetermined range, as well as by using a first fluorescent body and a second fluorescent body that have predetermined radiation spectra.

In other words, it has been found that the light emitting device 10 makes it possible to obtain radiation light that is recognized as more golden as compared with a light emitting device having the same excitation purity according to the prior art. Further, in the above configuration, by setting the excitation purity to a value exceeding 80%, radiation light that is recognized as golden even in an external light environment can be obtained. In addition, by further increasing the excitation purity, it is possible to emit golden light that is recognized as more golden even in a lighting environment such as an environment where external light is extremely strong, and even in the above-mentioned environment, it is possible to illuminate an object to be illuminated, such as, for example, a metal product, without impairing the original golden light of the object.

Further, the invention of the present application has been made with attention focused on a view that it is important to include fluorescent components in the blue-green band (490 to 530 nm band) with an intensity of a predetermined range in the radiation light in order to achieve golden light that is recognized as more golden. The inventors of the present application have found that the intensity of the light in the blue-green band emitted from the light emitting device 10 can be adjusted by using the second fluorescent body having an absorption (excitation) effect in the blue-green band thereby to attenuate the light in the blue-green band from the first fluorescent body.

Further, it has been found that the radiation light having the fluorescent components in the blue-green band adjusted as described above is the radiation light that is recognized as more golden than the radiation light having the same excitation purity according to the prior art. In addition, increasing the excitation purity of the golden light makes it possible to achieve the golden light that is visually recognized more clearly as a gold color in external light (white light) and when light is reflected from an object when the light is irradiated. Therefore, it has been found that it is possible to achieve a semiconductor light emitting device that emits golden light that is visually recognized more clearly as a gold color.

(2) Light Reflected from an Object

The light emitting device 10 of the present embodiment can emit radiation light with the chromaticity thereof adjusted so that an object, such as an object to be lighted, appears golden when the radiation light is irradiated to the object. The color of the object and appropriate irradiation light for the object will be described with reference to FIG. 8.

The light emitting device 10 of the present embodiment emits light within a chromaticity region enclosed by four lines, namely, for example, a line with a main wavelength of 565 nm (line L1 connecting a point with 0% excitation purity and a point on the spectral locus), line L5 with a main wavelength of 585 nm, a line with an excitation purity of 97% (EP2), and a line with an excitation purity of 80% (EP1). Further, the chromaticity region is composed of four chromaticity regions of golden light (segmented chromaticity regions) RA, RB, RC, and RD, which are segmented for every 5 nm by three lines having main wavelengths of 570 nm, 575 nm, and 580 nm.

By adjusting the radiation light of the light emitting device 10 such that the radiation light is the light within one of the four chromaticity regions so as to match the color of an object to be irradiated, when the radiation light irradiates the object to be illuminated, the irradiated object appears to have a golden reflective color. In other words, the reflective color appears to be the same as a reflective color under a standard light source such as D65, or as a reflective color with an enhanced gold color.

Specifically, the chromaticity can be adjusted such that a painted object appears golden when the object is irradiated. When the object was painted in, for example, a masonry stone color #988c81 (hexadecimal code), it was appropriate that the irradiation light had a chromaticity in an RC region. More specifically, the object is located in a region on a yellow side with respect to the gold color, and the light from the light emitting device is adjusted in chromaticity to light of a color located in a region on an orange side, thus making the object appear golden.

Figure 9:
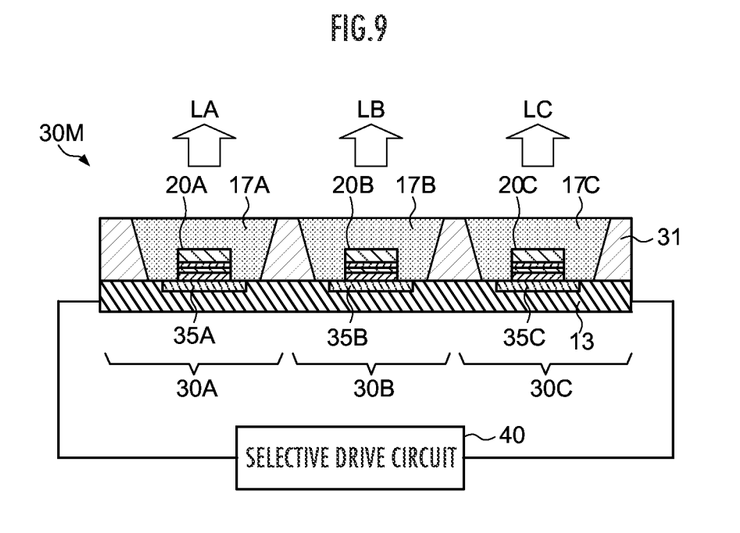
FIG. 9 is a diagram schematically illustrating the configuration of a semiconductor light emitting module 30M according to another embodiment of the present invention.

FIG. 9 is a diagram schematically illustrating the configuration of a semiconductor light emitting module 30M according to another embodiment of the present invention. Three semiconductor light emitting devices 30A, 30B, and 30C (hereinafter collectively referred to as the semiconductor light emitting device 30 unless it is necessary to distinguish among them) that are similar to the semiconductor light emitting device 10 illustrated in FIG. 1A and FIG. 1B are connected to constitute an integrated light emitting device.

More specifically, the semiconductor light emitting module 30M has a frame 31 having three inverted pyramid-shaped openings (recesses), and semiconductor light emitting elements 20A, 20B, and 20C (hereinafter collectively referred to as the semiconductor light emitting element 20 unless it is necessary to distinguish among them) are mounted on a substrate 13 within the three recesses, respectively. The semiconductor light emitting elements 20A, 20B, and 20C have a configuration similar to that of the semiconductor light emitting element 20 of the embodiment described above, and the semiconductor light emitting elements 20A, 20B, and 20C emit, for example, blue light having an emission peak wavelength ($\lambda d$) of 445 nm and a half width ($\lambda_{FWHM}$) of 19 nm.

Each of the semiconductor light emitting elements 20A, 20B, and 20C are embedded in fluorescent body sections (sealing sections) 17A, 17B, and 17C (hereinafter, collectively referred to as the fluorescent body section 17 unless it is necessary to distinguish among them). Each of the fluorescent body sections 17A, 17B, and 17C is made of a translucent sealing resin, and a plurality of fluorescent bodies are contained in the resin. For example, each of the fluorescent body sections 17A, 17B, and 17C contains a first fluorescent body (a YAG fluorescent body) and a second fluorescent body (an α-sialon fluorescent body) as in the embodiment described above.

The fluorescent properties of the fluorescent body sections 17A, 17B, and 17C differ from each other. The semiconductor light emitting devices 30A, 30B, and 30C are configured to emit light LA, LB, and LC within chromaticity regions RA, RB, and RC, respectively (FIG. 8). For example, the chromaticity of the radiation light of each of the semiconductor light emitting devices 30A, 30B, and 30C is set to be different by changing the ratios or the concentrations of the first fluorescent bodies and the second fluorescent bodies.

In other words, in the semiconductor light emitting module, the ratios or concentrations of the first fluorescent bodies and the second bodies of the semiconductor light emitting devices 30A, 30B, and 30C differ from each other so as to emit light of chromaticity within mutually different segmented chromaticity regions of an n number of segmented chromaticity regions when the chromaticity region enclosed by lines with main wavelengths of 565 nm and 585 nm and lines with excitation purities of 80% and 97% is segmented into the n number of chromaticity regions.

The semiconductor light emitting elements 20A, 20B, and 20C are connected to substrate wirings 35A, 35B, and 35C, respectively, provided on a substrate 13, and configured to be selectively driven by a selective drive circuit 40.

Thus, selectively driving the semiconductor light emitting elements 20A, 20B, 20C in accordance with the color of an object to be irradiated makes it possible for the irradiated object to appear golden when the radiation light irradiates the object to be irradiated.

[Characteristics of the Semiconductor Light Emitting Elements, the First Fluorescent Body and the Second Fluorescent Body]

The following will specifically describe the characteristics of the semiconductor light emitting elements 20 of the semiconductor light emitting devices 10, 30, the first fluorescent body, and the second fluorescent body described above.

In order for the radiation light from the semiconductor light emitting device to be golden light that is visually recognized clearly as golden in external light and also when the radiation light is irradiated on an object and reflected from the object, the following conditions are suitable.

The semiconductor light emitting element 20 irradiates blue light of a wavelength range of 440 to 450 nm thereby to excite the first fluorescent body and the second fluorescent body in the fluorescent body section 17.

The first fluorescent body and the second fluorescent body irradiate, by the excitation, light of the first emission spectrum and light of the second emission spectrum.

The emission peak wavelength of the first fluorescent body is longer than the peak wavelength of the semiconductor light emitting element 20 and shorter than the emission peak wavelength of the second fluorescent body. In other words, the emission color of the first fluorescent body is green-yellow and the emission color of the second fluorescent body is red-yellow. The combined light of the light emission of the first fluorescent body and the light emission of the second fluorescent body has a wavelength peak between the emission peak of the first fluorescent body and the emission peak of the second fluorescent body.

More specifically, the emission peak wavelength of the emission spectrum of the first fluorescent body is in the range of 540 to 575 nm, and the emission peak wavelength of the emission spectrum of the second fluorescent body is in the range of 590 to 605 nm.

As the first fluorescent body, a YAG fluorescent body, an LSN fluorescent body (LnxSiyNn: Z, Z being an activator, and x, y, n being integers), an LuAG fluorescent body (Lu3Al512: Ce), or the like can be used. As the second fluorescent body, a sialon fluorescent body, a SCASN fluorescent body ((Sr, Ca) AlSiN3: Z), a CASN fluorescent body ((Sr, Ca) AlSiN3: Z), or the like can be used. It is preferable that the first fluorescent body is a YAG fluorescent body and the second fluorescent body is an α-sialon.

Regarding the component of the output light (blue light) of the semiconductor light emitting element 20 in the radiation light from the semiconductor light emitting device 10 or 30, i.e., regarding the output light (blue light) of the semiconductor light emitting element 20, the intensity of the blue light emitted from the semiconductor light emitting device 10 or 30 via the fluorescent body section 17 (the fluorescent body layer) that includes the first fluorescent body and the second fluorescent body is preferably $1/10$ to $1/60$ of the intensity of the combined light from the first fluorescent body and the second fluorescent body in order to obtain radiation light that has a high excitation purity and is recognized as more golden.

Further, the excitation purity in the CIE1931 chromaticity coordinates of the radiation light emitted from a semiconductor light emitting device is preferably in the range of 81% to 97%, and more preferably in the range of 85% to 95% in particular.

In addition, the ratio of the second fluorescent body to the first fluorescent body in the fluorescent body layer of the fluorescent body section 17 is preferably set such that the second fluorescent body absorbs the blue-green light in a band of 490 to 530 nm from the first fluorescent body thereby to reduce the radiation intensity of the blue-green light from the fluorescent body layer to 20 to 60% of the radiation intensity of the blue-green light from the first fluorescent body itself, and more preferably to 20 to 50% thereof.

DESCRIPTION OF REFERENCE NUMERALS

10: semiconductor light emitting device; 11; frame; 12A, 12B: external electrode; 13: substrate; 14A, 14B: via wiring; 15A, 15B: substrate wiring: 17 fluorescent body section (sealing section); 20: semiconductor light emitting element: 20A, 20B, 20C: semiconductor light emitting element: 30A, 30B, 30C: semiconductor light emitting device: and 30M: semiconductor light emitting module.

The invention claimed is:

1. A semiconductor light emitting device comprising:
a semiconductor light emitting element which emits excitation light having a peak wavelength in a range of 440 to 450 nm; and
a fluorescent body layer which is provided on the semiconductor light emitting element and contains a first fluorescent body and a second fluorescent body that emit first fluorescent light and second fluorescent light, respectively, by the excitation light from the semiconductor light emitting element, wherein the first fluorescent light has a peak wavelength in a range of 540 to 575 nm, and the second fluorescent light has a peak wavelength in a range of 590 to 605 nm, and wherein in mixed color light of radiation light of the semiconductor light emitting element, radiation light from the first fluorescent body, and radiation light from the second fluorescent body, which is emitted from the fluorescent body layer, an intensity of the radiation light of the semiconductor light emitting element is $1/10$ to $1/60$ of an intensity of combined light of the radiation light from the first fluorescent body and the radiation light from the second fluorescent body.

2. The semiconductor light emitting device according to claim 1, wherein an integral value of an intensity of a blue-green light component in a band of 490 to 530 nm in the combined light of the radiation light from the first fluorescent body and the radiation light from the second fluorescent body is in a range of 2 to 7% of an integral value of an intensity of the entire combined light.

3. The semiconductor light emitting device according to claim 1, wherein a ratio of the second fluorescent body to the first fluorescent body in the fluorescent body layer is a value at which the second fluorescent body absorbs a fluorescent component of blue-green light in a band of 490 to 530 nm from the first fluorescent body thereby to reduce an intensity of the fluorescent component of the blue-green light from the first fluorescent body to an intensity in a range of 20% to 60% at a time of emission from the fluorescent body layer.

4. The semiconductor light emitting device according to claim 1, wherein an excitation purity in CIE1931 chromaticity coordinates of the mixed light is in a range of 81% to 97%.

5. The semiconductor light emitting device according to claim 1, wherein a main wavelength of the mixed light ranges from 565 to 585 nm.

6. The semiconductor light emitting device according to claim 1, wherein the first fluorescent body is a YAG fluorescent body, and the second fluorescent body is an α-sialon.

7. The semiconductor light emitting device according to claim 1, wherein a composition formula of the first fluorescent body is expressed by Y3Al5O12: Ce, and a composition formula of the second fluorescent body is expressed by (Si, Al) 12 (O, N) 16: Ca, Eu.

8. A semiconductor light emitting module comprising an n (n being an integer of 2 or more) semiconductor light emitting devices according to claim 1, wherein ratios or concentrations of the first fluorescent bodies and the second fluorescent bodies differ from each other such that, in a case where a chromaticity region enclosed by lines having main wavelengths of 565 nm and 585 nm in CIE1931 chromaticity coordinates and lines having excitation purities of 80% and 97% is segmented into n of chromaticity regions, the n semiconductor light emitting devices emit light of chromaticity in mutually different segmented chromaticity regions of the n segmented chromaticity regions.

* * * * *